(12) United States Patent  (10) Patent No.: US 7,692,635 B2
Iwamura  (45) Date of Patent: Apr. 6, 2010

(54) USER INTERFACE WITH THIN DISPLAY DEVICE

(75) Inventor: Ryuichi Iwamura, San Diego, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 1243 days.

(21) Appl. No.: 11/069,614

(22) Filed: Feb. 28, 2005

(65) Prior Publication Data

US 2006/0195801 A1  Aug. 31, 2006

(51) Int. Cl.
*G09G 5/00* (2006.01)
(52) U.S. Cl. ............... 345/172; 345/169; 715/961; 715/974
(58) Field of Classification Search ............. 345/156, 345/168, 173, 184, 161, 172; 715/858, 961, 715/965, 974
See application file for complete search history.

(56) References Cited

U.S. PATENT DOCUMENTS

| 4,430,540 | A | 2/1984 | Scalf |
| 5,237,327 | A | 8/1993 | Saitoh et al. |
| 5,572,239 | A * | 11/1996 | Jaeger .................. 345/184 |
| 5,936,613 | A * | 8/1999 | Jaeger et al. .......... 345/184 |
| 5,959,610 | A | 9/1999 | Silfvast |
| 6,259,436 | B1 * | 7/2001 | Moon et al. ........... 345/173 |
| 6,356,045 | B1 | 3/2002 | Newton et al. |
| 6,546,297 | B1 | 4/2003 | Gaston et al. |
| 6,570,583 | B1 | 5/2003 | Kung et al. |
| 6,642,919 | B1 * | 11/2003 | Jaeger et al. .......... 345/161 |
| 6,728,382 | B1 | 4/2004 | Silfvast |
| 2002/0105504 | A1 | 8/2002 | Toepke et al. |
| 2002/0180622 | A1 | 12/2002 | Lui et al. |
| 2003/0107549 | A1 | 6/2003 | Lu |
| 2004/0032395 | A1 | 2/2004 | Goldenberg et al. |
| 2004/0066415 | A1 | 4/2004 | Khoo et al. |
| 2004/0256378 | A1 | 12/2004 | Shukla |

* cited by examiner

*Primary Examiner*—Kevin M Nguyen
(74) *Attorney, Agent, or Firm*—Steven L. Nichols

(57) ABSTRACT

A user interface includes a thin display device and at least one control device. The control device is associated with a portion of the thin display device. A method of implementing a user interface for a device includes displaying data about a function of the device on a thin display device, the data being displayed in association with a control device that controls that function of the device.

16 Claims, 6 Drawing Sheets

USER INTERFACE WITH THIN DISPLAY DEVICE

BACKGROUND

Providing a user interface for a particular device can present a number of challenges. Conceptually, a user interface needs a control device or devices that can be manipulated by the human user to provide input to control a particular device. Some user interfaces also incorporate a display device or other indicators for presenting information about the device or for showing a response to user input entered with the control device.

A common type of user interface is a graphical user interface ("GUI"). A GUI is typically used with a computer or similar device that incorporates a display device. The GUI includes icons and windows that are displayed by the device and can be selected and manipulated using appropriate control devices, for example, a mouse and keyboard. A GUI provides great flexibility in that it can be adapted to receive a wide variety of user input to control a wide variety of diverse applications. However, to implement a GUI, the device generally has to have an existing display device and the processing power to support the programming for the GUI. Additionally, the device must usually support such peripherals as a mouse and keyboard for receiving the user input to the GUI. This entails both space and cost requirements. Finally, a GUI is not well adapted to the rapid adjustment of operational parameters on a very fine level or in a continuous manner, such as is available with a dedicated dial or knob.

In some examples, a GUI is implemented with a touch sensitive screen. The touch sensitive screen displays the GUI elements, but does not have to receive input using a mouse or keyboard. Rather, user input is received by sensing a physical touch against the screen to select a displayed element, such as an icon or button. Such interfaces are good for operating menus and turning options on and off. However, like other GUIs, touch sensitive screens are not well adapted for the rapid fine tuning of operational parameters.

Other types of user interfaces may not include any display device, but simply include various control devices for receiving user input. Examples of devices that include such interfaces include audio equipment such as mixer boards. Such interfaces can include knobs or dials for rapidly entering fine adjustments to operational parameters in a continuous manner. However, if there are a large number of operational parameters to control, the number of control devices needed may be large and difficult to accommodate in a reasonably compact interface.

SUMMARY

A user interface includes a thin display device and at least one control device. The control device is associated with a portion of the thin display device. A method of implementing a user interface for a device includes displaying data about a function of the device on a thin display device, the data being displayed in association with a control device that controls that function of the device.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

Figure 1:
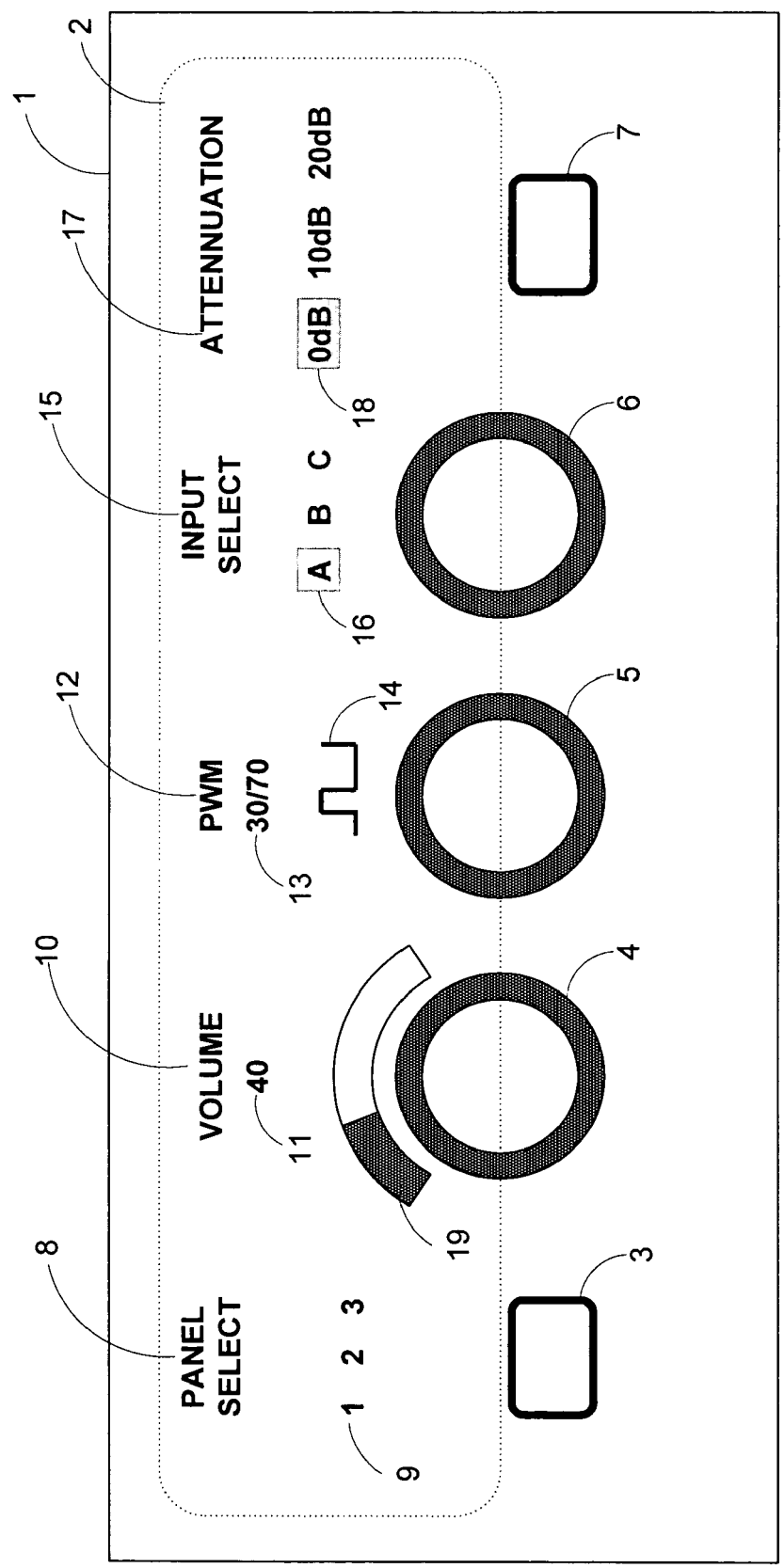
FIG. 1 illustrates an exemplary user interface according to principles described herein.

The present specification describes a user interface that incorporates a thin display device in association with one or more control devices. The thin display device allows the user to make better use of the available control devices by illustrating the operation of each control device and, for example, minimizing the number of physical control devices needed to fully control the device. The thin display device weighs less and requires less space and power than display devices in traditional user interfaces.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one example" or "an example" means that a particular feature, structure, or characteristic described in connection with the example is included in at least one example. The appearance of the phrase "in one example" in various places in the specification are not necessarily all referring to the same example.

As used herein and in the appended claims, unless otherwise specifically denoted, the term "controlled device" or "device" will be used broadly to refer to any device, apparatus or system that is controlled by input from a user through a user interface. A device may be, but is not limited to, an oscilloscope, a logic analyzer, a remote control, a waveform generator, a music synthesizer or an audio mixer.

As used herein and in the appended claims, unless otherwise specifically denoted, the term "control device" will be broadly understood to refer to any component the manipulation of which by a user can be accepted as input to a device. A control device may be, but is not limited to, a button or key, a push switch, a switch, a knob, a dial, a slider, a keyboard, a keypad, a mouse, a track-pad, a trackball, a touch-sensitive panel or a joystick.

A useful control device for making rapid and continuous adjustment to relatively fine operational parameters is the rotary knob. The circuitry associated with a rotary knob is typically a variable resistor known as a potentiometer. The change in rotational angle of the rotary knob alters the amount of current flowing through the variable resistor. This may directly adjust an operational parameter or be interpreted by other circuitry as a command to accordingly alter an operational parameter.

In some instances, a device known as a rotary encoder is used to measure and quantify the change in the rotational position of a rotary knob. The information gathered by an encoder can be represented on a display of the user interface to indicate the current setting of the rotary knob. Alternatively or additionally, the output of the encoder can be stored so as to record a particular setting of the rotary knob.

In some exemplary systems, the current state of various control devices, such as rotary knobs, push switches, and other control devices, can be saved at any time. The user can then restore the saved state of the control devices at a later time. In effect, this returns the device to the operational state that it was in when the control device settings were saved. The action required to save and restore the operational state of the device can be as simple as activating a press switch.

The term "user interface" will be understood to refer to one or more control devices for controlling a device. A user interface may or may not include a display device. However, the exemplary user interfaces described herein incorporate a thin display device.

As used herein and in the appended claims, the term "thin display device" or "thin display panel" will be used to refer to a particular class of display devices that are thinner, lighter and require less power than such display devices as liquid crystal displays (LCDs). LCDs are specifically excluded from the group of "thin display devices" as used herein. Examples of thin display devices include thin-film transistor backplane displays, electrophoretic displays, electro-optic displays, organic electro-luminescent displays and microcapsule displays.

A thin display device may be flexible and paper-like. A thin display device typically does not need backlighting to effectively produce a visible display. Ambient light that is reflected by the display is sufficient to make the displayed image visible to the viewer. Consequently, the thin display device has relatively lower power requirements. Moreover, a thin display device typically only uses power when the image being displayed is changed. As a result, an image being displayed will not disappear if power to the thin display device is interrupted or discontinued.

FIG. 1 illustrates an exemplary manual user interface that may be adapted for use with a variety of devices such as a waveform generator or music synthesizer according to the principles described herein. As shown in FIG. 1, the front panel (1) includes several control devices (3-7). In the illustrated example, the control devices include two push switches (3 and 7) and three rotary knobs (4-6).

The front panel (1) also comprises a thin display device (2). The several control devices (3-7) are specifically associated with portions of the thin display device (2) as will be described below.

For example, the functionality of each control device (3-7) as well as the current value of the parameter that device controls is shown on the display (2). The left most rotary knob (4) is configured to control the volume setting (10) of the device. The value of the volume setting (10) is viewable on the display (2) as either a numeric value (11) and/or as a curved bar graph (19). Both indicators show that the volume setting is set at forty percent of the maximum possible volume setting. The level of detail provided by the displayed indicators (11 and 19) in association with the rotary knob control device (4) greatly facilitate the process of fine tuning the volume setting.

As shown in FIG. 1 the center rotary knob (5) is configured to control a pulse width modulation (PWM) setting (12) of the device. PWM is a term that is used to describe the percentage of time that a signal is at high and low levels. A PWM setting of 50/50 indicates that the signal spends equal amounts of time at high and low levels. A PWM setting of 30/70 indicates that the signal being controlled is spending 30% of the time at a high level and the other 70% of the time at a low level. The value of the PWM setting (12) is viewable on the display (2) as both a ratio of numbers (13) and as a waveform (14) that graphically displays the relative amounts of time that the signal spends at high and low levels.

The display (2) is capable of displaying and associating a waveform with any control device. In one example, the waveform (14) corresponding to the PWM setting (12) is an idealized image of the signal being controlled. In general, the waveform corresponding to any parameter and control device can either be an idealized representation or can be a graphical representation of an actual analog signal. This provides excellent means for observing and altering different aspects of a signal being controlled. Devices such as, but not limited to, signal generators and musical synthesizers could benefit from the ability to observe and finely tune different aspects of the waveforms corresponding to the signals they generate.

As shown in FIG. 1, the right most rotary knob (6) is configured to control the input select setting (15) of the device. The available inputs and the currently selected input (16) are shown on the thin display device (2). In the illustrated example, the input corresponding to option 'A' (16) is the selected input. Consequently, 'A' is highlighted in the display of options (16) or, alternatively, options 'B' and 'C' are grayed out. Any means of indicating which of the displayed options (16) is the selected option may be used. By rotating the rotary knob (6), the other options may be selected. The display (2) will change the display of the available options (16) to indicate the newly-selected option by, for example, graying out the unselected options or highlighting the selected option.

As shown in FIG. 1, the right most control device is a push switch (7). A push switch is a button that may be pressed to cycle through a number of options. Each press of the push switch selects the next available option for the parameter being controlled. In the illustrated example, the switch (7) is configured to control the attenuation setting (17) of the device. Attenuation refers to the amount by which the amplitude of a signal is decreased from a standard or maximum level. Attenuation is traditionally measured in units of decibels (dB). As with the input select setting (15), the selected attenuation setting (18) is indicated on the display (2), for example, as the option that is highlighted or not grayed out. By manipulating the push switch (7), the attenuation setting (17) can be changed from 10 dB to any of the other available attenuation setting options (18).

As also shown in FIG. 1, the left most control device is a push switch (3). In the illustrated example, the switch (3) is configured to control the panel select setting (8) of the interface. Each "panel" option represents a different assignment of various functions to the available control devices (4-7). In this way, different functions are assigned to the various control devices (4-7) of the interface so as to decrease the total number of physical control devices needed.

As before, the active panel select (9) setting is indicated on the display as the option that is, for example, highlighted or not grayed out. By manipulating the push switch (3) any of the panel select settings (9) may be activated. The various panel select settings may be numbered, as in the illustrated example.

By activating another panel select option, a different function is assigned to each of the other control devices (4-7). In one example, when panel select setting '2' (9) is activated, the control devices (4-7) will cease to control volume (10), PWM (12), input select (15), and attenuation (17), respectively, and will be reassigned to control frequency, phase, output select and amplification, respectively. The thin display (2) is updated to reflect the options corresponding to the new parameter being controlled by the each control device (4-7) so that the user can readily ascertain which parameter is controlled by which device (4-7) and the current setting for that parameter.

This method of reassigning the functionality of each control device and updating the thin display (2) to reflect the change can be used to significantly reduce the number of control devices required by the user interface of a device. For example, a standard audio mixer has at least four parameters to control each channel. These parameters often include input select, volume control, tone control, and pan control. Volume, tone, and pan are properties of audio signals. If an audio mixer has 24 channels and uses a control device for each of these four parameters per channel, the user interface for the mixer must have at least 96 control devices. Alternatively, the user interface described herein could achieve the same functionality with four control devices to control the different parameters of each channel and one additional control device to act as a panel select control to select among the available 24 channels to be controlled. In this example, the interface described herein reduces the number of control devices from 96 to 5. This results in a significant decrease in size of the user interface from the traditional implementation.

Another advantage of the capacity to reassign the parameters controlled by each control device is that the user can customize the interface. The user can specify which parameter should be assigned to a certain control device on a certain panel. In the example of FIG. 1, the volume control (10) and its corresponding indicators (11 and 19) can be moved to the center rotary knob (5). Accordingly, the PWM control (12) and its corresponding indicators (13 and 14) could be moved to the left most rotary knob.

In addition to manual configuration, the underlying software can automatically assign parameters to the different control devices and update the display (2). This feature can be used to aid the user in adjusting a large set of parameters. Methods describing this process will be discussed below.

Figure 2:
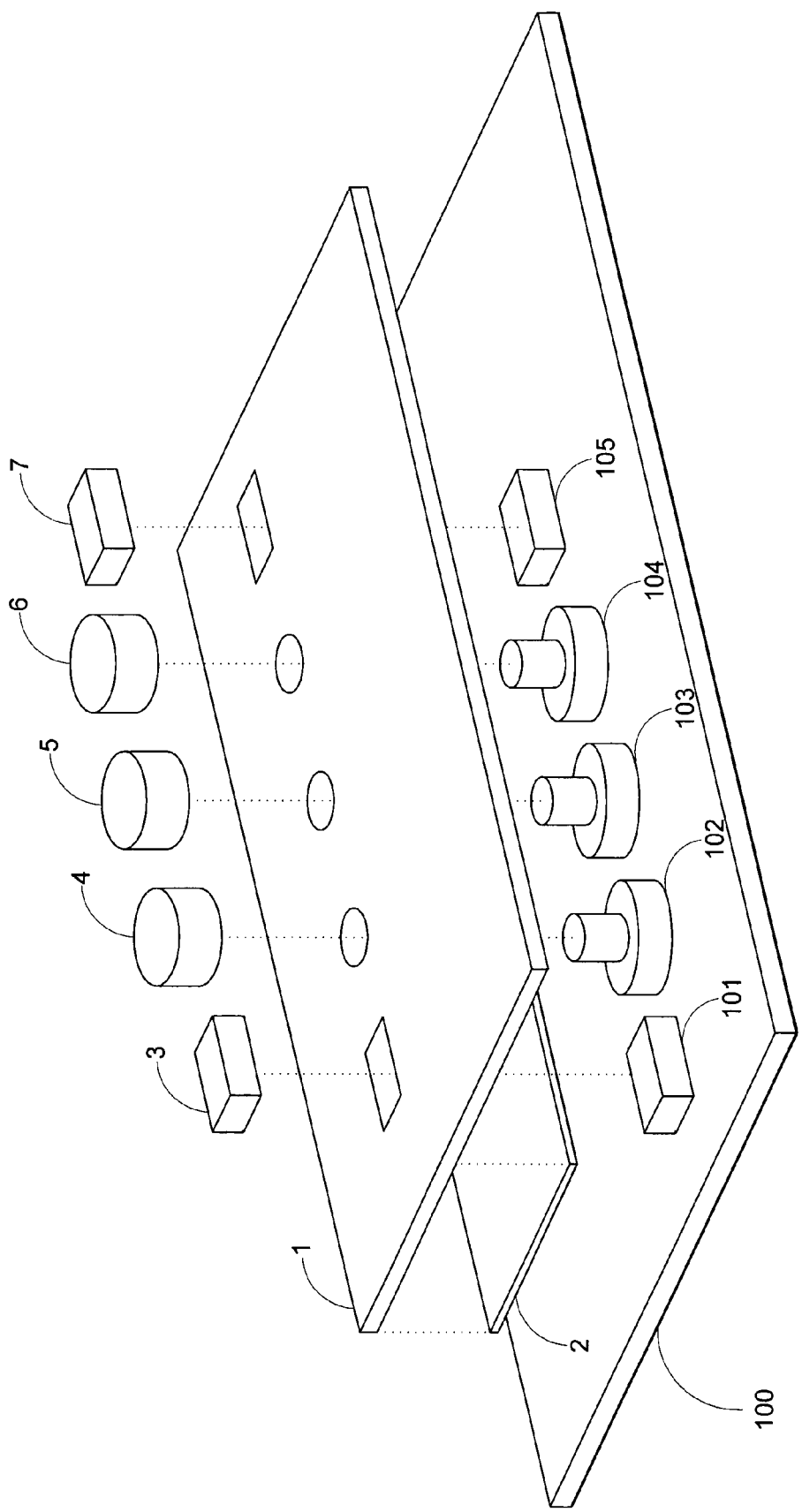
FIG. 2 is an assembly drawing of the user interface illustrated in FIG. 1.

FIG. 2 is an assembly drawing of an exemplary user interface according to principles described herein. The user interface illustrated is similar to the one described above with respect to FIG. 1.

The user interface comprises a circuit board (100) (for example, a printed circuit board), a thin display panel (2), a front panel (1), and the components corresponding to several control devices (3-7 and 101-105). The thin display panel (2) is positioned beneath the front panel (1) of the user interface. At least that portion of the front panel (1) that overlays the thin display panel (2) is transparent. The transparency of the front panel (1) allows the display panel (2) to be seen by the user, while protecting the thin display panel (2).

In the illustrated example, the thin display panel (2) has a bottom layer of thin film transistors and corresponding leads that connect to the printed circuit board (100). Push switches (101 and 105) and rotary encoders (102, 103, and 104) are mounted on the printed circuit board (100) and extend through holes in the front panel (1). The corresponding knobs (4-6) and buttons (3 and 7) are connected, respectively, to the encoders (102-104) and to the switches (101 and 105) so as to be mounted on the front panel (1) of the interface.

As described above, each control device (3-7) is located so as to be physically associated with a portion of the thin display panel (2). Consequently, data regarding the setting of the parameter controlled by that control device can be shown on the corresponding portion of the thin display panel (2) to increase the functionality of the user interface.

Generally, it is difficult to make a hole in a traditional display panel so as to pass a portion of a control device through it without disrupting the operation of the display. Consequently, the configuration illustrated in FIG. 2 does not need any holes to be made in the thin display device (2).

However, when using the thin display panel (2) it is much easier to make holes in the display so as to associate more display area with each control device (3-7). Thus, another example shown in FIG. 3, holes are made in the thin display panel (2) and control devices are passed through them without detrimental effect to the operation of the display.

Figure 3:
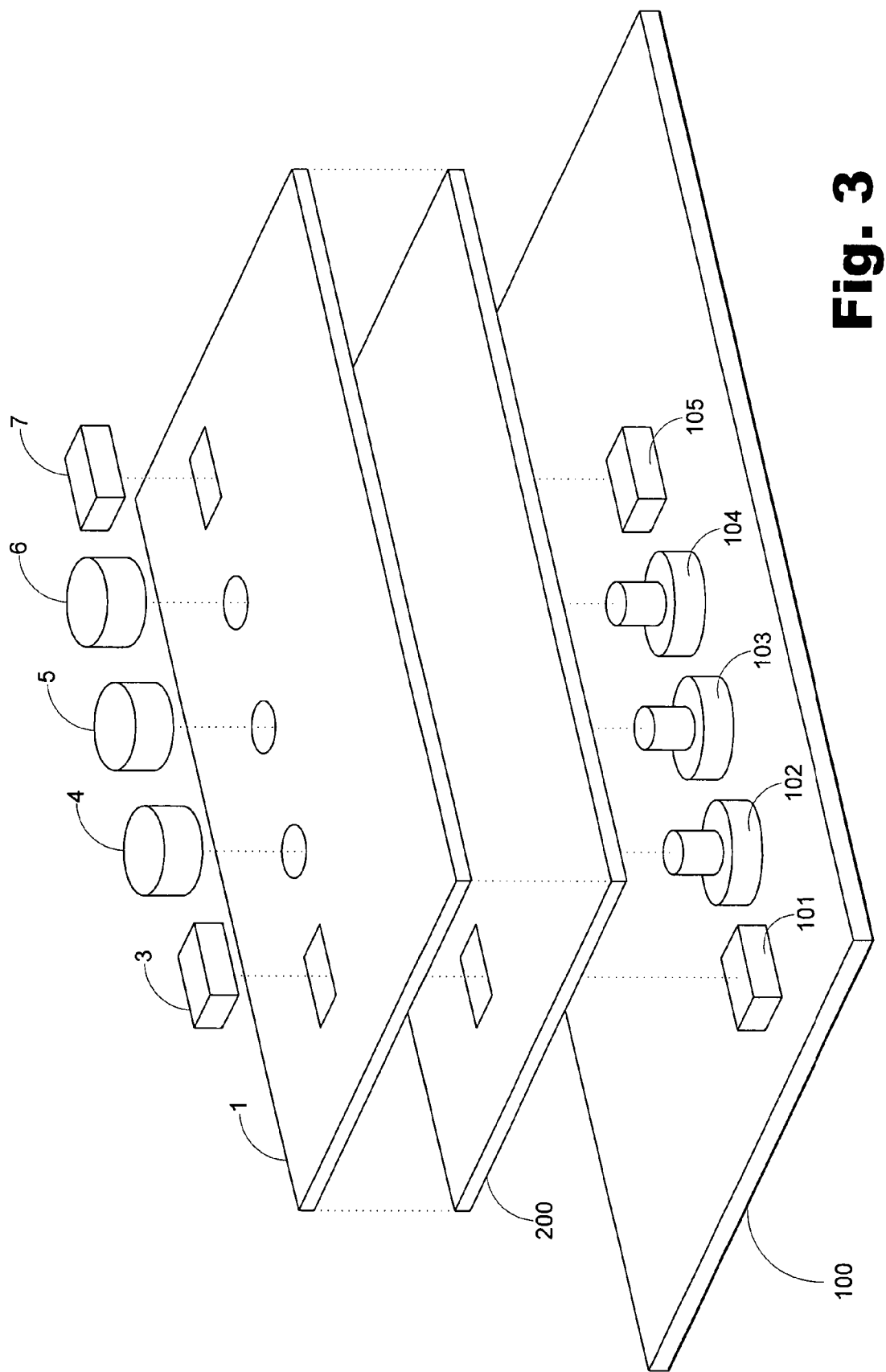
FIG. 3 is an assembly drawing of another exemplary user interface according to principles described herein.

FIG. 3 is an assembly drawing of this exemplary interface that uses a thin display panel (200) with holes therein. The user interface again comprises a circuit board (100), a thin display panel (2), a front panel (1), and the components corresponding to several control devices (3-7 and 101-105). The thin display panel (200) is again positioned beneath the front panel (1) of the user interface. Most or all of the front panel (1) is transparent. Consequently, the relatively large transparent surface area of the front panel (1) allows the larger display panel (200) to display more information to the user. This allows greater flexibility in designing the layout of control devices.

As before, in the illustrated example, the display panel (200) has a bottom layer of thin film transistors and corresponding leads that connect to the printed circuit board (100). Push switches (101 and 105) and rotary encoders (102, 103, and 104) are mounted on the printed circuit board (100) and extend through holes in the thin display panel (2) and the front panel (1). The corresponding knobs (4-6) and buttons (3 and 7) are connected, respectively, to the encoders (102-104) and to the switches (101 and 105) so as to be mounted on the front panel (1) of the interface.

Figure 4:
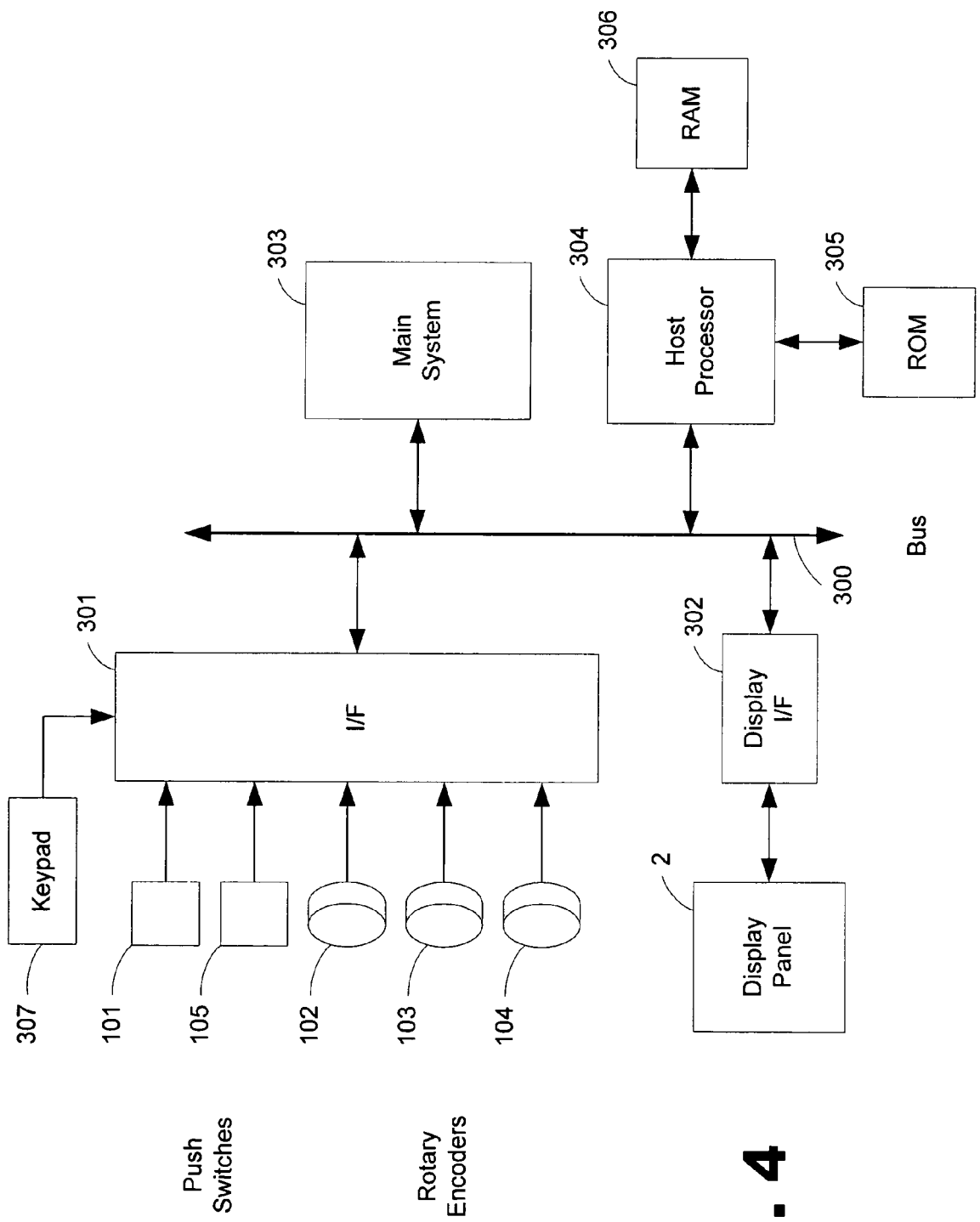
FIG. 4 illustrates an exemplary configuration of digital hardware that facilitates the operation of a user interface according to principles described herein.

FIG. 4 is a block diagram of a user interface and portions of a controlled device according to the principles described herein. A host processor (304) controls all of the other components of the hardware via an internal bus (300). The execution of this control is directed by the instructions or firmware stored in a read only memory (ROM) (305). For example, function names, values, waveforms and other information are sent from the host processor (304) to the display interface (302). The display interface (302) then drives the thin display panel (2) to display the data, graphics and text, received from the host processor (304).

A control device interface (301) receives user input from the various control devices of the user interface, for example, push switches (101 and 105), rotary encoders (102, 103, and 104), and a keypad (307). The control device interface (301) relays the input to the host processor (304) via the bus (300).

The host processor (304) stores the user input and device configuration information to random access memory (RAM) (306). Subsequently, configuration settings that have been stored can be readily restored to the device. For example, if the user has achieved a particular parameter set for the controlled parameters that will be needed again, the user can have the host processor (304) store that set of parameters or configuration settings in memory. The user can then also, using the user interface, have the host processor (304) retrieve and restore that set of parameters so as to rapidly bring the controlled device back to a desired operational configuration.

As these stored parameter sets may need to be maintained over time, until again needed by the user, non-volatile memory can be included in the system for storing the saved parameter set. Non-volatile memory does not lose the stored information when the system is disconnected from power. In some examples, a non-volatile memory unit is added to the system shown in FIG. 4. In other examples, the RAM (306) is or incorporates non-volatile memory.

The main system (303) represents the remainder of the device to be controlled. The host processor (304) controls the main system (303) based upon the user input received through the control devices (101-105, and 307) as described above.

The user interface described herein is controlled by the firmware or software stored in the ROM (305). This adds a significant degree of flexibility to the user interface. The user can customize the layout of the interface and store the customized version of the interface in memory (306). The manufacturer can release firmware or software updates as needed to correct problems or upgrade the operation of the user interface.

Figure 5:
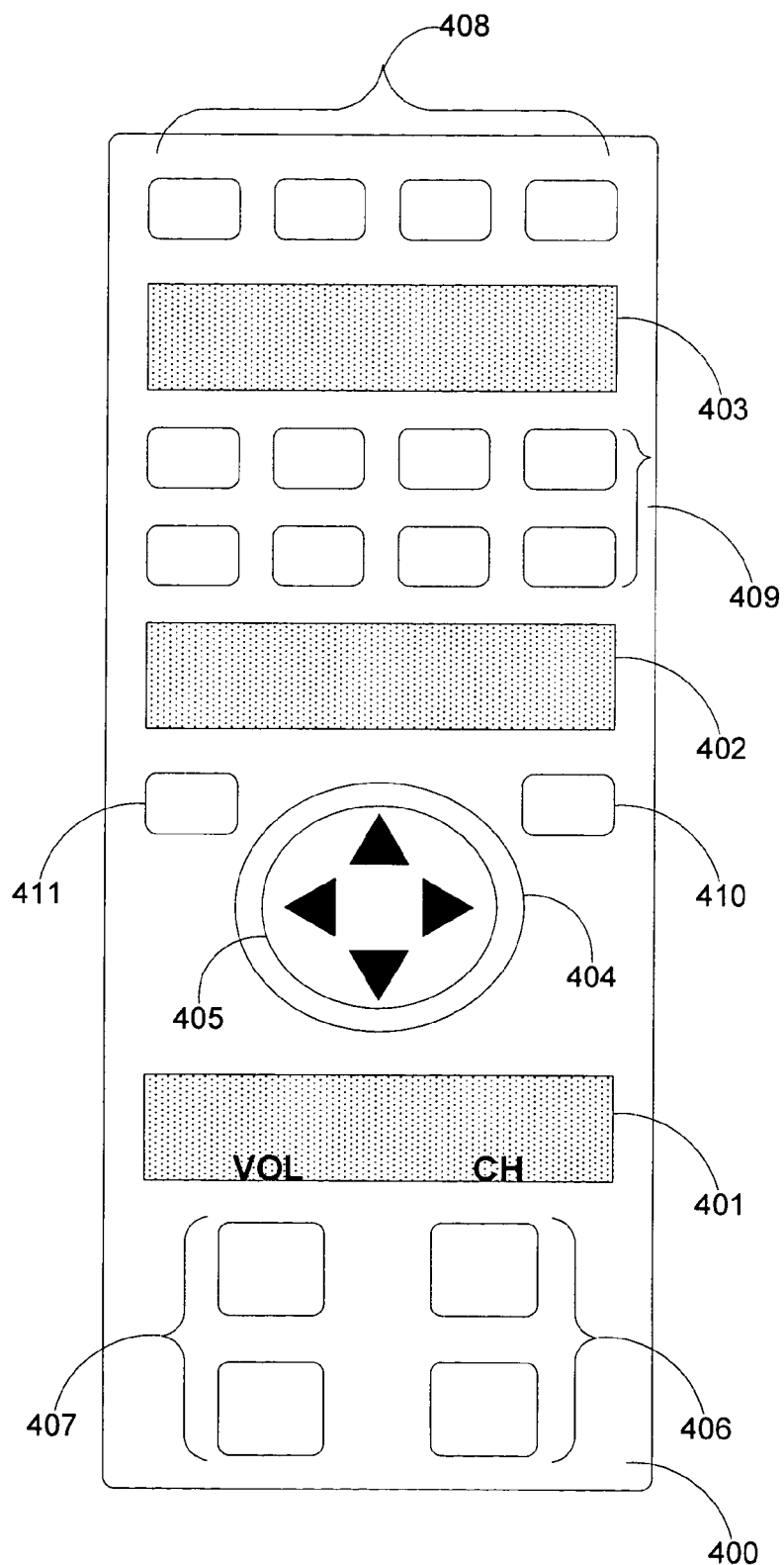
FIG. 5 illustrates an exemplary embodiment of a user interface in a remote control unit according to principles described herein.

FIG. 5 illustrates an exemplary embodiment of a user interface in a remote control unit according to the principles described herein. While offering the ability to customize the controls, many existing remote control units use LCD displays. However, the power consumption and the relatively large, thick size of an LCD display create constraints in a handheld remote control unit.

The user interface described herein provides a more compact, more user friendly remote control unit. As shown in FIG. 5, the illustrated example of a user interface for a remote control unit (400) comprises three thin display panels (401-403), a shuttle ring (404), a cursor button (405), and several groups of buttons, keys or push switches (406-411).

As described above, with the thin displays (401-403) in place, the function assigned to various control devices on the remote control unit (400) may be changed to provide greater functionality without needing additional control devices. In the illustrated example, one of the push switches is reserved for the function of switching modes. For example, these modes include, but are not limited to, a video mode and a television mode. In video mode, the remote control unit (400) controls a video signal source such as a Digital Video Disk (DVD) player, Video Cassette Recorder (VCR), camcorder or the like. In television mode, the remote control unit (400) controls the operation of a television, video monitor or flat panel display device on which video programming is being shown.

When the mode is changed, an appropriate function is automatically selected for and assigned to every control device on the remote control unit (400). In one example, while the remote control unit (400) is in video mode, the shuttle ring (404) is assigned to control jog. By manipulating the shuttle ring (404), video can be advanced and reversed at different rates. While the remote control unit (400) is in television mode a jog control has no meaning or use. As a result, the shuttle ring (404) is then assigned to control the volume setting.

As described above, the user can change the button layout as desired. For example, in the illustrated example of FIG. 5, some of the push switches (407) on the remote control unit (400) are assigned to control the volume setting, and some of the push switches (406) are assigned to control the channel select. The user can swap these and other functions assigned to each push switch. This may be especially advantageous for users who are left handed.

Figure 6:
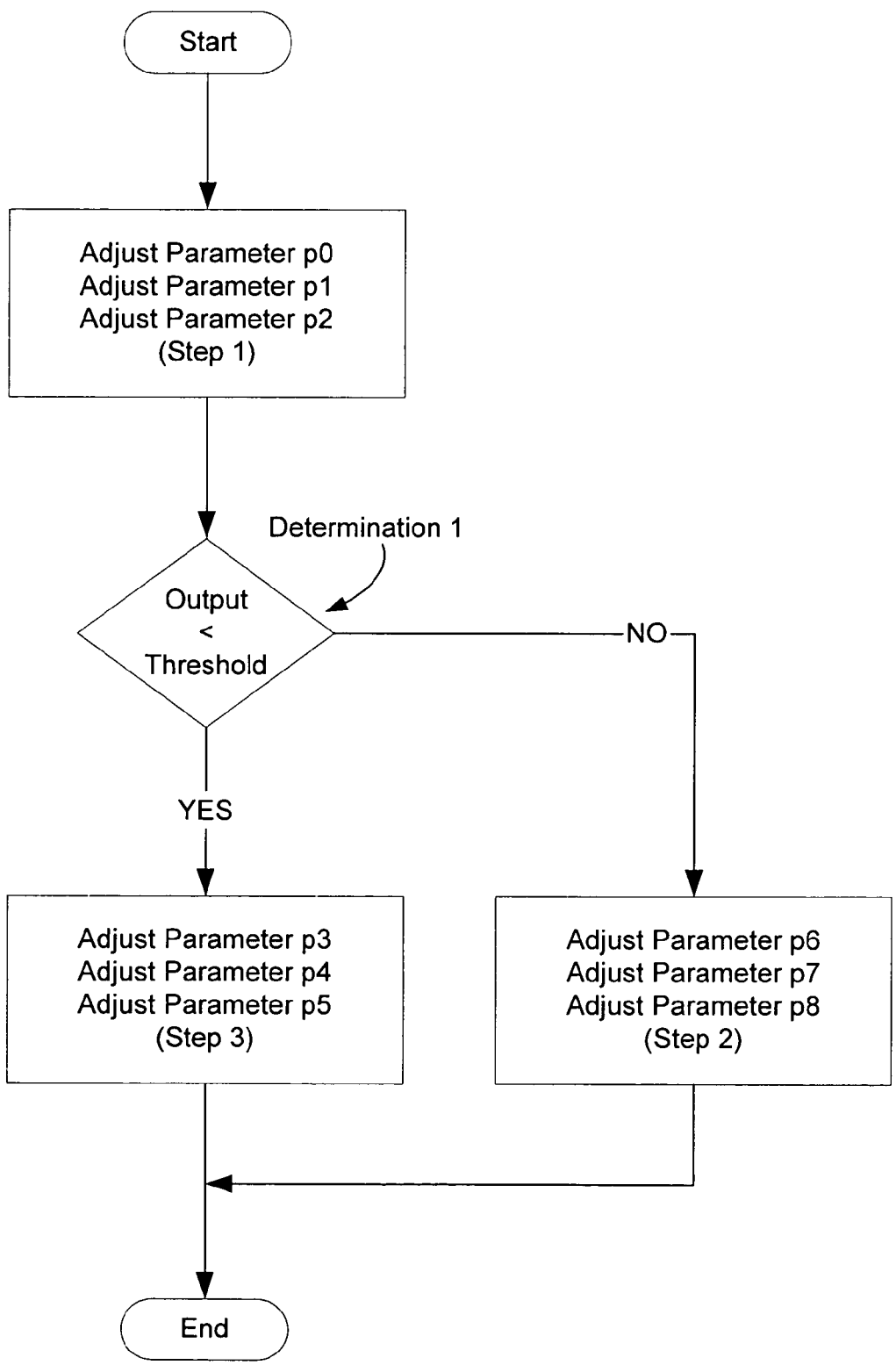
FIG. 6 illustrates an exemplary method of adjusting parameters using a user interface according to principles described herein.

FIG. 6 illustrates an exemplary method of adjusting parameters using an example of a user interface as described herein. The interface described herein is excellent for a system that requires a large number of parameters to be set in a sequential manner. An exemplary method of adjusting parameters is illustrated by the flow chart of FIG. 6 with conditional branches.

As shown in FIG. 6, the firmware or software of the interface can assign a set of parameters (p0, p1, and p2; step 1) to the control devices and indicate on the thin display panel that the parameters should be adjusted. After the parameters are adjusted, the operational configuration can be checked against some standard (determination 1). If the output or operation of the device does not meet a certain standard or threshold (No, determination 1), the firmware can automatically assign another set of parameters (p6, p7, and p8; step 2) to the control devices. As before, the display can indicate to the user the parameters that need to be adjusted. If the output or performance does meet the threshold (Yes, determination 1), a different set of parameters (p3, p4, and p5) may be assigned to the control devices. This process may be repeated until the firmware or the user determines that the output or performance of the device is acceptable.

The firmware that controls the interface can automatically assign functions to the control devices and use the display to communicate instructions to the user. This process allows complicated adjustments to be performed quite easily by following the instructions provided on the thin display panel. It also provides an excellent means by which the interface can deal with exceptional events. If an exceptional event occurs, the firmware can use the thin display panel to indicate to the user that an event has occurred and can guide the user through the process of adjusting the parameters that will restore the device to normal operation The preceding description has been presented only to illustrate and describe embodiments of the invention. It is not intended to be exhaustive or to limit the invention to any precise form disclosed. Many modifications and variations are possible in light of the above teaching. It is intended that the scope of the invention be defined by the following claims.

What is claimed is:

1. A user interface comprising:
   a thin display device;
   a processor communicatively coupled to said thin display device; and
   at least one control device associated with a portion of said thin display device;
   in which said processor is configured to, responsive to a determination that an operation associated with said processor does not meet a threshold for said operation, automatically assign at least one parameter to said at least one control device and prompt a user with said thin display device to adjust said parameter using said control device.

2. The user interface of claim 1, further comprising a transparent panel disposed protectively over said thin display device.

3. The user interface of claim 1, further comprising a circuit board supporting said thin display device and said at least one control device.

4. The user interface of claim 1, wherein said at least one control device comprises a rotary dial.

5. The user interface of claim 1, wherein said at least one control device comprises a push switch.

6. The user interface of claim 1, wherein a graph is displayed on said thin display device in association with said control device.

7. The user interface of claim 1, wherein a depiction of a waveform is displayed on said thin display device in association with said control device.

8. The user interface of claim 1, wherein a number of options are displayed on said thin display device in association with said control device, wherein a selected option, selected using said control device is indicated on said thin display device.

9. The user interface of claim 1, wherein a user can control said function assigned to said at least one control device, said thin display device displaying data in association with said control device that depends on said function assigned to said control device.

10. A method of implementing a user interface for a user-controlled device comprising a thin display device and an associated control device, said method comprising:
  responsive to determining that an operation associated with said user-controlled device does not meet a standard set for said operation, automatically assigning at least one parameter of said user-controlled device to said control device such that said parameter is controlled by said control device;
  indicating on said thin display device, in association with said control device, a current setting for said parameter controlled by the control device; and
  prompting a user with said thin display device to adjust said parameter using said control device to bring said operation into compliance with said standard.

11. The method of claim 10, said user interface comprising a plurality of control devices each controlling a parameter of said device, said method further comprising storing a set of parameters defining an operational configuration for said device.

12. The method of claim 11, further comprising restoring said operational configuration using said set of parameters stored by said user interface.

13. The method of claim 10, further comprising protectively covering said thin display device with a panel that is at least partially transparent.

14. The method of claim 10, further comprising displaying a depiction of a waveform on said thin display device in association with said control device.

15. The method of claim 10, further comprising:
  displaying a number of options on said thin display device in association with said control device, wherein said control device is used to select among said options; and
  indicating a selected option on said thin display device.

16. The method of claim 10, further comprising:
  selectively assigning different functions to a plurality of control devices; and
  displaying data in association with each control devices that depends on a function assigned to said control device.

* * * * *